(12) United States Patent
Meng

(10) Patent No.: US 8,728,948 B2
(45) Date of Patent: May 20, 2014

(54) METHOD OF MANUFACTURING SEMICONDUCTOR DEVICE

(75) Inventor: Lingkuan Meng, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/700,775

(22) PCT Filed: Sep. 5, 2012

(86) PCT No.: PCT/CN2012/081009
§ 371 (c)(1),
(2), (4) Date: Nov. 29, 2012

(87) PCT Pub. No.: WO2014/005371
PCT Pub. Date: Jan. 9, 2014

(65) Prior Publication Data
US 2014/0011303 A1 Jan. 9, 2014

(30) Foreign Application Priority Data
Jul. 3, 2012 (CN) .......................... 2012 1 0229524

(51) Int. Cl.
*H01L 21/302* (2006.01)
(52) U.S. Cl.
USPC .................... 438/714; 438/711; 257/E21.267
(58) Field of Classification Search
USPC ....................................................... 438/727
See application file for complete search history.

(56) References Cited

U.S. PATENT DOCUMENTS

| | | | |
|---|---|---|---|
| 2008/0299724 A1 | 12/2008 | Grudowski et al. | |
| 2011/0031538 A1* | 2/2011 | Hsieh et al. | 257/288 |
| 2012/0205715 A1* | 8/2012 | Kwok et al. | 257/190 |
| 2012/0248550 A1* | 10/2012 | Huang et al. | 257/410 |

FOREIGN PATENT DOCUMENTS

| | | |
|---|---|---|
| CN | 102034711 | 4/2011 |
| CN | 102280411 | 12/2011 |

OTHER PUBLICATIONS

Search Report and Written Opinion from PCT/CN2012/081009, dated Apr. 18, 2013.

* cited by examiner

*Primary Examiner* — Cheung Lee
(74) *Attorney, Agent, or Firm* — Westman, Champlin & Koehler, P.A.

(57) ABSTRACT

A method of manufacturing a semiconductor device is disclosed. The method may comprise: forming a gate stack on a substrate; depositing a first dielectric layer and a second dielectric layer sequentially on the substrate and the gate stack; and etching the second dielectric layer and the first dielectric layer sequentially with an etching gas containing helium to form a second spacer and a first spacer, respectively. According to the method disclosed herein, a dual-layer complex spacer configuration is achieved, and two etching operations where the etching gas comprises the helium gas are performed. As a result, it is possible to reduce damages to the substrate and also to reduce the process complexity. Further, it is possible to optimize a threshold voltage, effectively reduce an EOT, and enhance a gate control capability and a driving current.

18 Claims, 3 Drawing Sheets

US 8,728,948 B2

METHOD OF MANUFACTURING SEMICONDUCTOR DEVICE

CROSS-REFERENCE TO RELATED APPLICATION

This application is a Section 371 National Stage Application of International Application No. PCT/CN2012/081009, filed 5 Sep. 2012, in Chinese, which claims priority to Chinese Application No. 201210229524.9, entitled "METHOD OF MANUFACTURING SEMICONDUCTOR DEVICE," filed on Jul. 3, 2012, the contents of which are hereby incorporated by reference in their entirety.

TECHNICAL FIELD

The present disclosure relates to the field of manufacture of semiconductor integrated circuits, and particularly, to a method of etching a spacer.

BACKGROUND

In manufacture of Large Scale Integrated Circuits, generally a dielectric spacer is formed before a Light Doped Drain (LDD) implantation process, to prevent source/drain implantation at a greater dose from being too close to a channel to cause source-drain punch-through, which in turn results in device failure and a reduced yield.

Presently, a popular 65 nm node spacer or even a 45 nm node spacer can be fabricated as follows. Before the LDD implantation process, a thin film layer of silicon oxide is deposited or thermally grown. For example, the layer of silicon oxide can be grown by means of Rapid Thermal Oxidation (RTO) to a thickness of about 30 Å, and then can serve as an etching stop layer for protecting a substrate, especially interfaces of source/drain regions close to a channel region, from damages, to avoid increase of defect densities. Further, a well conformal thin film layer of silicon nitride is deposited to surround a polysilicon gate. Finally, portions of the silicon nitride on the substrate and the gate can be removed away by means of plasma etching, which is stopped on the underlying oxide layer. As a result, the spacer is achieved.

On the other hand, as critical dimensions are continuously scaling down according to the Moore's Law, the conventional gate oxide/polysilicon gate configuration is going further away from requirements of advanced logic devices, and thus is being replaced gradually by the high K-metal gate configuration. Further, the gate last process is becoming a dominant one because of its good control of thermal effects and threshold voltages, but causes many new difficulties and challenges. The gate should have a reduced height, to cope with the challenge of filling the metal gate occurring in the development of the CMOS manufacture processes. To fill the metal in a solid manner, it is necessary to reduce a depth-to-width ratio of a gate line. Further, due to continuous scaling of a gate pitch, the thickness of a first spacer is continuously decreasing. To precisely control the repeatability, reliability, and stability of the etching process, it is necessary to slow down an etching rate to fight with increasingly stringent challenges of the etching process. This tends to deteriorate the uniformity of the etching rate of the spacer. Especially, current spacer etching techniques are generally based on Ar-based gases, which tend to make damages to the substrate, particularly for nanometer-scale devices. Especially, when the liner layer of silicon oxide over the gate is very thin, it is easy for oxygen plasma to penetrate through the thin oxide layer to react with the substrate, resulting in a great silicon loss.

SUMMARY

In view of the above, the present disclosure aims to provide, among others, a novel method of etching a spacer, by which it is possible to reduce damages to a substrate, and also to effectively reduce an EOT and enhance a gate control capability and a driving current.

According to an aspect of the present disclosure, there is provided a method of manufacturing a semiconductor device, comprising: forming a gate stack on a substrate; depositing a first dielectric layer and a second dielectric layer sequentially on the substrate and the gate stack; and etching the second dielectric layer and the first dielectric layer sequentially with an etching gas containing helium to form a second spacer and a first spacer, respectively.

In an example of the present disclosure, etching the second dielectric layer and the first dielectric layer may comprise: performing a main etching operation on the second dielectric layer to form the second spacer, with a remainder of the second dielectric layer left on the first dielectric layer; performing an over etching operation to remove the remainder of the second dielectric layer; and performing etching to remove exposed portions of the first dielectric layer on the substrate.

In a further example of the present disclosure, the gate stack may comprise a gate dielectric layer and a gate electrode layer. The gate electrode layer may comprise any of polysilicon, amorphous silicon, and a metal gate. The gate dielectric layer may comprise any of silicon oxide, silicon nitroxide, and a high K material.

In a further example of the present disclosure, the first dielectric layer may comprise silicon oxide, and depositing thereof may comprise RTO, PECVD, or SACVD.

In a further example of the present disclosure, the second dielectric layer may comprise silicone nitride or diamond-like amorphous carbon and depositing thereof may comprise LPCVD or PECVD.

In a further example of the present disclosure, the etching may adopt etching gases including a fluorine-based gas, an oxidizing gas and a helium-based gas.

In a further example of the present disclosure, the main etching operation may comprise adjusting an electrode power, a chamber pressure, and a ratio of flow rates of the reactive gases to enhance anisotropy so as to achieve the spacer with a steep profile.

In a further example of the present disclosure, the over etching operation may comprise adjusting an electrode power, a chamber pressure, and a ratio of flow rates of the reactive gases to achieve a great etching selectivity of the dielectric layer with respect to the substrate.

In a further example of the present disclosure, the selectivity can be greater than 10:1.

In a further example of the present disclosure, the fluorine-based gas may comprise a fluorocarbon gas or $NF_3$.

In a further example of the present disclosure, the fluorine-based gas for the main etching operation may comprise $CF_4$, $CHF_3$, and $CH_2F_2$.

In a further example of the present disclosure, the fluorine-based gas for the over etching operation may comprise $CF_4$, $CH_3F$, and $CH_2F_2$.

In a further example of the present disclosure, the oxidizing gas may comprise $O_2$.

In a further example of the present disclosure, the helium-based gas may comprise a helium gas, or a mixture of a helium gas and an argon gas.

In a further example of the present disclosure, the main etching operation can be stopped by an endpoint detection system which is triggered by a change in spectrum lines of reactants and resultants, and then the over etching operation is started, so as to etch the dielectric layer away on the entire wafer.

In a further example of the present disclosure, the main etching operation can be performed for a time period required for the main etching to proceed to the proximity to a surface of the substrate, which is calculated based on an etching rate, and then the over etching operation is started, so as to etch the dielectric layer away on the entire wafer.

In a further example of the present disclosure, the main etching operation and/or the over etching operation may be performed in an etcher apparatus based on a CCP or ICP mode.

In a further example of the present disclosure, the first dielectric layer may be etched by a HF-based wet etching solution.

In a further example of the present disclosure, the method may further comprise: implanting ions into the substrate, with the first and second spacers as a mask, to form source and drain regions; removing the dummy gate stack to form a gate groove; and filling a gate dielectric layer comprising a high K material and a gate conductor layer comprising a metal material into the gate groove, to form a high K-metal gate stack.

According to the method disclosed herein, a dual-layer complex spacer is achieved, and two etching operations where the etching gas comprises the helium gas are performed. As a result, it is possible to reduce damages to the substrate and also to reduce the process complexity. Further, it is possible to optimize a threshold voltage, effectively reduce the EOT, and enhance the gate control capability and the driving current.

BRIEF DESCRIPTION OF THE DRAWINGS

Hereinafter, exemplary embodiments of the present disclosure will be described in detail with reference to attached drawings, in which.

DETAILED DESCRIPTION

Hereinafter, exemplary embodiments of the present disclosure will be described in detail with reference to attached drawings. It is to be noted that like symbols denote like structures throughout the drawings. Here, terms, such as "first," "second," "on," "below," "thick," and "thin," are used to describe various device structures. However, such descriptions are not intended to imply relationships of the described device structures in terms of space, order or layer-level, unless otherwise indicated.

Figure 1:
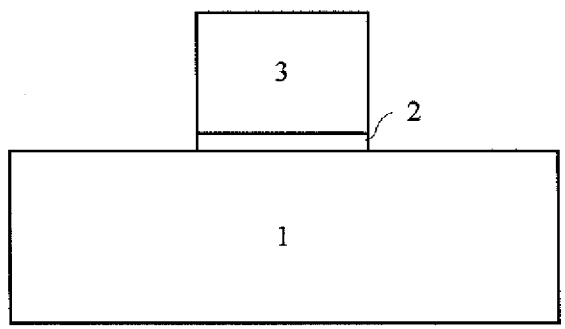
FIGS. 1-5 are cross-sectional views schematically showing a process of manufacturing a semiconductor device according to an embodiment of the present disclosure.
Figure 6:
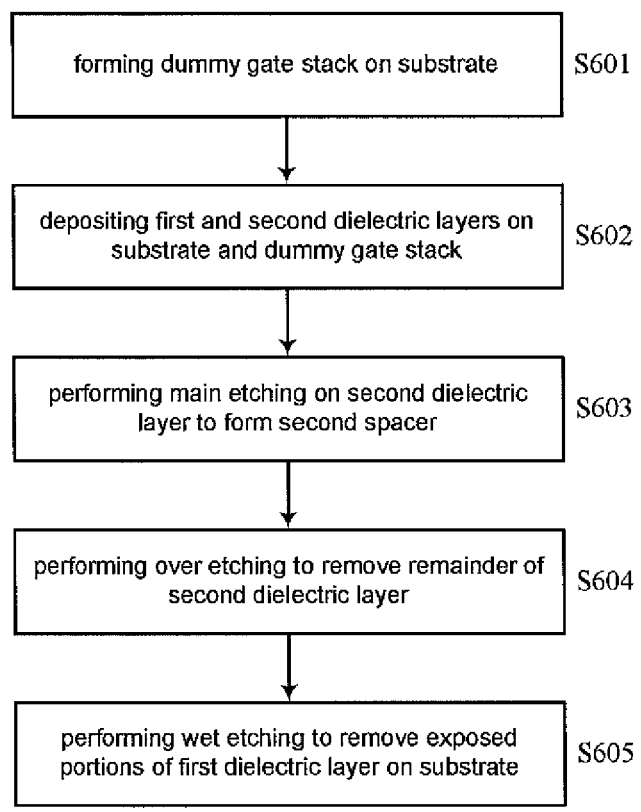
FIG. 6 is a flow chart showing a method of manufacturing a semiconductor device according to an embodiment of the present disclosure.

Referring to FIG. 6 and FIG. 1, at S601, a gate stack is formed on a substrate. The gate stack can be one for a gate first process or for a gate last process. The substrate 1 is provided, and may comprise bulk Si, SOI, bulk Ge, GeOI, SiGe, GeSb, or a group III-V or group II-VI compound semiconductor substrate, such as GaAs, GaN, InP, and InSb. To be compatible with the existing CMOS processes and applicable to manufacture of large scale digital integrated circuits, the substrate 1 preferably comprises bulk Si or SOI. A relatively thin gate dielectric (or a gate oxide layer) 2 is formed on the substrate 1 by means of deposition, such as LPCVD, PECVD, thermal oxidation and RTO. The gate dielectric layer 2 may comprise $SiO_2$ with a thickness of about 1-5 nm, for example, for protecting the substrate when removing a dummy gate later in the gate last process. Alternatively, the gate dielectric layer 2 may comprise a high-K material for the gate last process. A gate electrode layer (or a dummy gate layer) 3 is formed on the gate dielectric layer 2 by means of LPCVD, a diffusion furnace, or the like. The dummy gate layer 3 may comprise polysilicon or amorphous silicon, for example. Then, the dummy gate layer 3 (and preferably also the gate oxide layer 2) is patterned by a photolithography/etching process, to form a dummy gate stack. The etching process may comprise plasma etching (with inert ions such as Ar), Reactive Ion Etching (RIE, with a fluorine-based gas), or anisotropic wet etching (with a TMAH solution for etching Si, and a HF-based solution for etching SiO, for example). The etching can be stopped on an interface between the gate oxide layer 2 and the gate electrode layer (or the dummy gate layer) 3. Alternatively, the etching can be done overly to some extent to expose the substrate 1. The pattern of the dummy gate stack 2/3 is not limited to a single line as shown in FIG. 1, but can comprise a plurality of parallel lines or lines intersecting each other locally according to a layout design, which are located at gate positions of MOSFETs to be formed later. Side walls of the dummy gate stack are substantially steep. That is, the dummy gate stack forms an angle of about 90 degrees (for example, within ±2.5° about 90°) with respect to the substrate.

Figure 2:
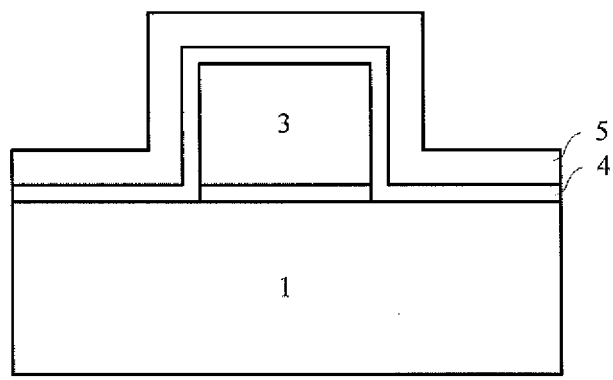

Referring to FIG. 6 and FIG. 2, at S602, dielectric layers are deposited on the dummy gate stack. If the gate dielectric layer 2 has not been etched in the process of FIG. 1, portions of the gate dielectric layer 2 outside the dummy gate stack can be removed by HF-based wet etching, preferably. Then, a first dielectric layer 4 and a second dielectric layer 5 each with a uniform thickness are formed on the entire substrate (or wafer) sequentially. Specifically, the first dielectric layer 4 can be formed by means of (Rapid) Thermal Oxidation (RTO), PECVD, Atmospheric CVD (SACVD), HDPCVD, or the like. The first dielectric layer 4 may comprise silicon oxide for serving as an etching stop layer later. The first dielectric layer 4 can be sufficiently thin to well control a final profile of a spacer. Preferably, the first dielectric layer may have a thickness of about 1-3 nm. The second dielectric layer 5 may be formed by a conventional deposition process, such as LPCVD and PECVD. The second dielectric layer 5 may comprise a material which is relatively hard and has a relatively great etching selectivity with respect to materials of the previously formed layers, such as silicon nitride and diamond-like amorphous carbon (DLC). The second dielectric layer 5 can serve as not only an insulating isolation for the side walls of the gate, but also a stress supply to a channel region for enhancement of a driving capability. Preferably, the second dielectric layer 5 comprises a thin film of silicon nitride deposited by PECVD. The second dielectric layer 5 may have a thickness of about 50-70 nm. The first dielectric layer 4 and the second dielectric layer 5 are conformal with the dummy gate stack as shown in FIG. 2.

Figure 3:
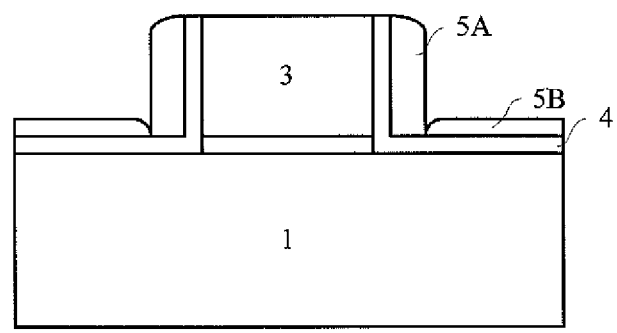

Referring to FIG. 6 and FIG. 3, at S603, a main etching operation is performed to anisotropically etch the second dielectric layer 5. The etching is stopped an the first dielectric layer 4, so as to form a second spacer 5A. For example, an etching apparatus, adopting a plasma etching system and based on a CCP or ICP mode, can be used. It is possible to adjust an electrode power, a chamber pressure, and a ratio of flow rates of reactive gases, to enhance the anisotropy so that portions of the second dielectric layer layer 5 on top of the dummy gate stack is completely removed, while portions thereof on the side walls of the dummy gate stack is substantially remained to constitute the second spacer 5A. There may be some remainder 5B of the second dielectric layer on a surface of the substrate (particularly, the first dielectric layer 4) in an active region. That is, the etching operation of the second dielectric layer 5 is performed until the first dielectric layer 4 is exposed. An etching gas adopted in the etching operation may comprise a fluorine-based gas, such as a fluorocarbon gas. Alternatively, other gases such as $NF_3$ and $SF_6$ are also feasible. To achieve a steep etching profile, it is necessary to optimize a ratio of radicals to ions in the fluorocarbon gas and to adjust an amount of polymers. According to an embodiment, the fluorocarbon gas may comprise $CF_4$, $CHF_3$, $CH_3F$, and $CH_2F_2$. Preferably, it is possible to remove the polymers by means of an oxidizing gas such as $O_2$ and CO. According to an example, the etching gas adopted in the main etching operation comprises a combination of $CF_4$ and $CHF_3$, a combination of $CF_4$ and $CH_2F_2$, or only $CHF_3$, and the oxidizing gas comprises $O_2$.

Further, to precisely control the repeatability, reliability, and stability of the etching process, it is necessary to slow down an etching rate thereof. In the prior art generally Ar is added as a diluent agent to slow down the etching rate. However, Ar has a great atomic weight and a great momentum, and thus imparts significant bombardment to the substrate. This tends to damage the underlying materials for nanometer-scale devices. Especially when the liner layer of silicon oxide over the polysilicon gate is very thin, it is easy for oxygen plasma to penetrate through the thin oxide layer to react with the substrate, resulting in a great silicon loss. Therefore, according to an embodiment of the present disclosure, the etching gas comprises a helium-based gas, such as a helium gas and a mixture of a helium gas and an argon gas, in addition to the fluorine-based gas which is the main constituent (and/or the oxidizing gas). In his way, it is possible to significantly reduce damages to the substrate. Further, it is difficult to achieve stable plasma by means of only the helium gas because of its small atomic weight and small collision cross section. Preferably, the mixture of the helium gas and the argon gas can be used, so that it is possible to achieve plasma dispersed more uniformly in the chamber, and thus to improve the etching uniformity. In other words, the helium-based gas preferably comprises the mixture of the helium gas and the argon gas.

When the etching proceeds to the surface of the underlying substrate 1, an endpoint detection system can be triggered automatically by a change in spectrum lines of the reactants and resultants, to stop the main etching operation. Then, the process quickly transits to an over etching operation. Alternatively, a time period for the main etching operation can be calculated based on the etching rate, so that the main etching proceeds to the proximity to the substrate surface, to achieve a steep profile without footing. After that time period, the over etching operation begins. The second spacer 5A has a width almost equal to or reduced by less than 10% with respect to the thickness of the originally formed second dielectric layer 5. Specifically, the width may be 50-70 nm. The remainder 5B of the second dielectric layer 5 left on the surface of the substrate 1 has a thickness much less than that of the originally formed second dielectric layer 5. For example, the thickness of the remainder 5B is less than 20% of the original thickness, and may be 10-15 nm. The second spacer 5A is substantially steep, that is, forms an angle of about 90 degrees with respect to the substrate 1. Particularly, at joints between the second spacer 5A and the substrate 1, there is substantially or completely no remainder of the dielectric layer 5 left at corners due to selection of etching stop condition(s). That is, the dielectric layer has a thickness of about 0 locally at the corners.

Figure 4:
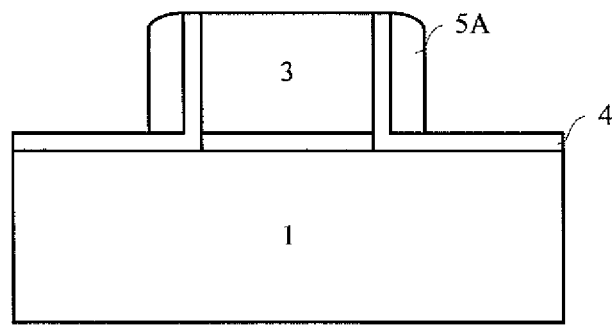

Referring to FIG. 6 and FIG. 4, at S604, the over etching operation is carried out to remove the remainder of the second dielectric layer. Specifically, it is necessary to remove the remainder 5B of the second dielectric layer over the entire wafer after the second spacer 5A with the steep profile is achieved by means of the main etching operation. Because the deposited second dielectric layer 5 may have its thickness varied across the wafer, it is necessary to add some over etching. To reduce damages to the substrate, it is desired that the dielectric layer 5 has a relatively great etching selectivity with respect to the first dielectric layer 4 (e.g., silicon oxide) and the substrate 1 (e.g., silicon), for improvement of device performances. For example, an etching apparatus, adopting a plasma etching system and based on a CCP or ICP mode, can be used. The selectivity of the second dielectric layer 5 (e.g., silicon nitride) with respect to the first dielectric layer 4 and the silicon substrate depends mainly on flow rates of the reactive gases and also a ratio thereof. Similarly to the main etching operation as shown in FIG. 3, the over etching operation shown in FIG. 4 mainly adopts a fluorine-based gas (e.g., fluohydrocarbon, preferably $CF_4$, $CH_2F_2$, and $CH_3F$, as described in conjunction with FIG. 3) and also an oxidizing gas (preferably, $O_2$, as described above) and a helium-based gas (serving as a diluent agent). A great selectivity above 10:1 (or preferably, even above 15:1) can be achieved by adjusting an electrode power, a chamber pressure, and a ratio of flow rates of the reactive gases, so as to make less damages to the substrate. According to an example, the etching gas adopted in the over etching operation may comprise a combination of $CF_4$ and $CH_3F$, a combination of $CF_4$ and $CH_2F_2$, or only $CH_3F$, and the oxidizing gas may comprise $O_2$. As a result, the second spacer 5A is remained, with other portions of the second dielectric layer 5 are removed, while the first dielectric layer 4 is remained as it is. Portions of the first dielectric layer 4 on the side walls of the dummy gate are covered by the second spacer 5A, while other portions thereof on the substrate 1 are exposed.

There are various etcher apparatuses from different manufacturers. They may have different chamber designs, but can be based on the same principle. Here, a case where an Exelan Hpt etcher from LAM is used is exemplified. Recommended parameters for the main etching operation and the over etching operation as described above are shown in Table 1.

TABLE 1

| Conditions | Pressure/ mtorr | HF/W | LF/W | $CF_4$/ sccm | $CHF_3$/ sccm | $CH_3F$/ sccm | $O_2$/ sccm | Ar/ sccm | He/ sccm |
|---|---|---|---|---|---|---|---|---|---|
| Main Etching | 100-150 | 100-300 | 0-200 | 3-20 | 15-30 | | 5-25 | 200-800 | 400-1200 |
| Over Etching | 100-200 | 100-300 | 0-100 | 3-10 | | 10-50 | 10-100 | 200-800 | 400-1200 |

Here, HF and LF indicate a high frequency power and a low frequency power, respectively. Table 1 exemplifies some specific etching gases and parameters. It is to be understood that other gases such as those described above are also feasible and that the parameters can be reasonably adjusted, provided that the over etching operation can achieve a sufficiently great selection ratio (e.g., above 15:1).

Figure 5:
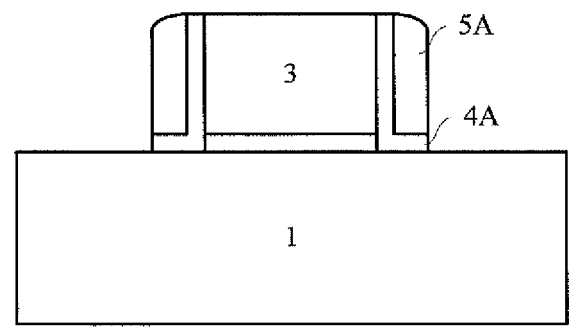

Referring to FIG. 6 and FIG. 5, at S605, the exposed portions of the first dielectric layer 4 on the surface of the substrate 1 is removed by etching, to form a first spacer 4A. The first spacer 4A and the second spacer 5A together constitute a dual-layer complex spacer configuration. The first dielectric layer 4, if it comprises silicon oxide, can be etched by a HF-based wet etching solution, such as a 5-10% Diluted HF solution (DHF) or a buffered etching solution (e.g., BOE, a mixture solution of HF and $NH_4F$), at a temperature of about 25° C. for a period depending on its thickness. After the etching, the first spacer 4A and the second spacer 5A are remained on opposite sides of the gate stack, together constituting the dual-layer complex spacer configuration.

As a result, the dual-layer complex spacer configuration is achieved. After that, the process can proceed as in the gate last process. Specifically, source/drain ion implantation can be carried out with the dual-layer complex spacer as a mask, to form source and drain regions. Metal silicide may be formed on/in the source and drain regions to reduce a resistance of the source and drain. An interlayer dielectric layer can be deposited on the entire wafer. The dummy gate stack can be removed by means of dry or wet etching, resulting in a gate groove, into which a gate dielectric layer comprising a high K material and a gate conductor layer comprising a metal material can be deposited sequentially. Then, the interlayer dielectric layer can be etched until the source and drain regions and/or the metal silicide are exposed to form source/drain contact holes, into which a metal material can be filled by deposition to form source/drain contact plugs.

According to the method disclosed herein, the dual-layer complex spacer configuration is achieved, and two etching operations where the etching gas comprises the helium gas are performed. As a result, it is possible to reduce damages to the substrate and also to reduce the process complexity. Further, it is possible to optimize a threshold voltage, effectively reduce the EOT, and enhance a gate control capability and a driving current.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:
1. A method of manufacturing a semiconductor device, comprising:
   forming a gate stack on a substrate;
   depositing a first dielectric layer and a second dielectric layer sequentially on the substrate and the gate stack; and
   etching the second dielectric layer and the first dielectric layer sequentially with an etching gas containing helium to form a second spacer and a first spacer, respectively,
   wherein etching the second dielectric layer and the first dielectric layer comprises:
   performing a main etching operation on the second dielectric layer to form the second spacer, with a remainder of the second dielectric layer left on the first dielectric layer;
   performing an over etching operation to remove the remainder of the second dielectric layer; and
   performing etching to remove exposed portions of the first dielectric layer on the substrate.

2. The method according to claim 1, wherein the gate stack comprises a gate dielectric layer and a gate electrode layer, wherein the gate electrode layer comprises any of polysilicon, amorphous silicon, and a metal gate, and the gate dielectric layer comprises any of silicon oxide, silicon nitroxide, and a high K material.

3. The method according to claim 1, wherein the first dielectric layer comprises silicon oxide, and depositing thereof comprises RTO, PECVD, or SACVD.

4. The method according to claim 1, wherein the second dielectric layer comprises silicon nitride or diamond-like amorphous carbon, and depositing thereof comprises LPCVD or PECVD.

5. The method according to claim 1, wherein the etching adopts etching gases including a fluorine-based gas, an oxidizing gas and a helium-based gas.

6. The method according to claim 5, wherein the main etching operation comprises adjusting an electrode power, a chamber pressure, and a ratio of flow rates of the reactive gases to enhance anisotropy so as to achieve the spacer with a steep profile.

7. The method according to claim 5, wherein the over etching operation comprises adjusting an electrode power, a chamber pressure, and a ratio of flow rates of the reactive gases to achieve a great etching selection ratio of the dielectric layer with respect to the substrate.

8. The method according to claim 7, wherein the etching selectivity is greater than 10:1.

9. The method according to claim 5, wherein the fluorine-based gas comprises a fluorocarbon gas or $NF_3$.

10. The method according to claim 9, wherein the fluorine-based gas for the main etching operation comprises $CF_4$, $CHF_3$, and $CH_2F_2$.

11. The method according to claim 9, wherein the fluorine-based gas for the over etching operation comprises $CF_4$, $CH_3F$, and $CH_2F_2$.

12. The method according to claim 5, wherein the oxidizing gas comprises $O_2$.

13. The method according to claim 5, wherein the helium-based gas comprises a helium gas, or a mixture of a helium gas and an argon gas.

14. The method according to claim 1, wherein the main etching operation is stopped by an endpoint detection system which is triggered by a change in spectrum lines of reactants and resultants, and then the over etching operation is started, so as to etch the dielectric layer away on the entire wafer.

15. The method according to claim 1, wherein the main etching operation is performed for a time period required for the main etching to proceed to the proximity to a surface of the substrate, which is calculated based on an etching rate, and then the over etching operation is started, so as to etch the dielectric layer away on the entire wafer.

16. The method according to claim 1, wherein the main etching operation and/or the over etching operation is performed in an etcher apparatus based on a CCP or ICP mode.

17. The method according to claim wherein the first dielectric layer is etched by a HF-based wet etching solution.

18. The method according to claim 1, stack is a dummy gate stack, and the method further comprises:

implanting ions into the substrate, with the first and second spacers as a mask, to form source and drain regions;
removing the dummy gate stack to form a gate groove; and
filling a gate dielectric layer comprising a high K material and a gate conductor layer comprising a metal material into the gate groove, to form a high K-metal gate stack.

* * * * *